(12) United States Patent
Cho et al.

(10) Patent No.: US 8,093,648 B2
(45) Date of Patent: Jan. 10, 2012

(54) METHOD FOR MANUFACTURING NON-VOLATILE MEMORY AND STRUCTURE THEREOF

(75) Inventors: An-Thung Cho, Hsin-Chu (TW); Chia-Tien Peng, Hsin-Chu (TW); Chih-Wei Chao, Hsin-Chu (TW); Wan-Yi Liu, Hsin-Chu (TW); Chia-Kai Chen, Hsin-Chu (TW); Chun-Hsiun Chen, Hsin-Chu (TW); Wei-Ming Huang, Hsin-Chu (TW)

(73) Assignee: Au Optronics Corp., Hsin-Chu (TW)

( * ) Notice: Subject to any disclaimer, the term of this patent is extended or adjusted under 35 U.S.C. 154(b) by 243 days.

(21) Appl. No.: 12/501,029

(22) Filed: Jul. 10, 2009

(65) Prior Publication Data

US 2010/0013001 A1 Jan. 21, 2010

(30) Foreign Application Priority Data

Jul. 17, 2008 (TW) .............................. 97127223 A

(51) Int. Cl.
*H01L 29/788* (2006.01)
(52) U.S. Cl. ................. 257/317; 257/325; 257/E29.309; 438/261; 438/287

(58) Field of Classification Search .................. 438/261, 438/287; 257/317, 325, E29.309
See application file for complete search history.

(56) References Cited

U.S. PATENT DOCUMENTS

| 6,410,412 | B1 | 6/2002 | Taira et al. | |
|---|---|---|---|---|
| 7,110,299 | B2 | 9/2006 | Forbes | |
| 7,335,556 | B2* | 2/2008 | Yamaguchi et al. | 438/257 |
| 2001/0042502 | A1 | 11/2001 | Shih et al. | |
| 2002/0076850 | A1* | 6/2002 | Sadd et al. | 438/90 |
| 2002/0153522 | A1 | 10/2002 | Park et al. | |
| 2006/0094253 | A1 | 5/2006 | Wu | |
| 2007/0066083 | A1* | 3/2007 | Yang et al. | 438/764 |
| 2007/0155137 | A1* | 7/2007 | Joshi et al. | 438/478 |
| 2007/0210368 | A1* | 9/2007 | Cho et al. | 257/314 |
| 2007/0267679 | A1* | 11/2007 | Cha et al. | 257/315 |

* cited by examiner

*Primary Examiner* — Trung Q Dang
(74) *Attorney, Agent, or Firm* — Rabin & Berdo, PC

(57) ABSTRACT

A method for manufacturing a non-volatile memory and a structure thereof are provided. The manufacturing method comprises the following steps. Firstly, a substrate is provided. Next, a semiconductor layer is formed on the substrate. Then, a Si-rich dielectric layer is formed on the semiconductor layer. After that, a plurality of silicon nanocrystals is formed in the Si-rich dielectric layer by a laser annealing process to form a charge-storing dielectric layer. Last, a gate electrode is formed on the charge-storing dielectric layer.

14 Claims, 7 Drawing Sheets

METHOD FOR MANUFACTURING NON-VOLATILE MEMORY AND STRUCTURE THEREOF

This application claims the benefit of Taiwan application Serial No. 97127223, filed Jul. 17, 2008, the subject matter of which is incorporated herein by reference.

BACKGROUND OF THE INVENTION

1. Field of the Invention

The invention relates in general to a method for manufacturing non-volatile memory and a structure thereof, and more particularly to a method for manufacturing non-volatile memory having silicon nanocrystals and a structure thereof.

2. Description of the Related Art

The non-volatile memory has the function of permanent memory. Of the semiconductor application elements, the non-volatile memory having the advantages of small volume, fast storage access speed, and low power consumption is often used in electronic products with portable mass storage such as digital camera, music player, and memory card. However, the non-volatile memory is already facing a size problem. As the size of the non-volatile memory is miniaturized, the film thickness of the tunneling oxide layer must be miniaturized accordingly (for example, being small than 5 nanometers). The tunneling oxide layer, undertaking many times of read/write access, is susceptible to defects which lead to the occurrence of leakage path and the loss of the electrical charges of the memory and make the memory incapable of maintaining its charging and memory function.

According to the current element structure of the non-volatile memory having nanocrystals, the nanocrystals exist in the thin film are used for replacing the conventional poly-Si floating gate in storing electrical charges. As deep levels formed by the nanocrystals are discrete traps, there is no interaction between the stored electrical charges, and the stored electrical charges will not lose easily due to the tunneling oxide layer being too thin or having defects. These features help to increase read and write speeds, reduce an operating voltage, and make a high density feasible.

The most difficult part in the manufacturing process of the memory element having nanocrystals is that the control of nanocrystal formation. The annealing process for the nanocrystals requires a high temperature (>900° C.) treatment needed for manufacturing silicon nanocrystals, but the high temperature treatment will damage the Si-substrate, even the glass substrate.

There are two conventional methods of manufacturing silicon nanocrystals: one is by precipitating silicon nanocrystals and the other is by growing silicon nanocrystals.

The conventional method of precipitating silicon nanocrystals is disclosed below. Firstly, a thermal silicon oxide layer having a thickness of 15 nanometer is deposited. Next, the thermal silicon oxide layer forms a Si-rich oxide layer by silicon (Si) ion implantation, wherein the Si-rich oxide layer is made from $Si_{1.75}O_2$, and the depth of ion implantation is 10 nm. Then, silicon nanocrystals are precipitated by a rapid thermal annealing (RTA) process at 1000° C. and 2% of oxygen content.

The conventional method of growing silicon nanocrystals is disclosed below. Firstly, an amorphous silicon (a-Si) layer grows by a process of low pressure chemical vapor deposition (LPCVD). Next, the a-Si layer grows silicon nanocrystals by high temperature furnace annealing process.

No matter the silicon nanocrystals are formed by rapid thermal annealing process or high temperature furnace annealing process, a high temperature (>1000° C.) annealing processing is required, and the high temperature heat treatment will damage the Si-substrate and the glass substrate which requires an even lower temperature. On the other hand, to obtain the Si-rich layer by ion implantation is not only time-consuming but also hard to control. As the panel size tends to become larger and larger, ion implantation will affect production capacity.

Besides, if the crystals being formed have a low density or dispersed distribution, the crystals will be incapable of storing sufficient electrical charges. If the electrons are too big or too close to each other, the electrons may jump to nearby nanocrystals or penetrate the underneath oxide layer and result in leakage of current.

The currently available technologies including ion implantation, heat treatment precipitation method or chemical vapor chromatography synthesis all have the disadvantages, such as quantum dots being too less, size being hard to control, and distribution being non-uniform, processing time being too long and operating temperature being too high, and fragile thin film. Thus, how to provide a non-volatile memory having nanocrystals with high density and uniform distribution has become a focus to the manufacturers.

SUMMARY OF THE INVENTION

The invention is directed to a non-volatile memory and a manufacturing method thereof. A charge-storing dielectric layer having silicon nanocrystals is formed by a laser annealing process. As the manufacturing process has a low temperature, no damage will be caused to the substrate or other elements.

According to a first aspect of the present invention, a method for manufacturing non-volatile memory is provided. The manufacturing method comprises the following steps. Firstly, a substrate is provided. Next, a semiconductor layer is formed on the substrate. Then, a Si-rich dielectric layer is formed on the semiconductor layer. After that, a plurality of silicon nanocrystals are formed in the Si-rich dielectric layer by a laser annealing process to form a charge-storing dielectric layer. Last, a gate electrode is formed on the charge-storing dielectric layer.

According to a second aspect of the present invention, a non-volatile memory is provided. The non-volatile memory comprises a substrate, a semiconductor layer, a charge-storing dielectric layer and a gate electrode. The semiconductor layer disposed on the substrate comprises a first doping area, a second doping area and a channel area, wherein the channel area is located between the first doping area and the second doping area. The charge-storing dielectric layer disposed on the semiconductor layer comprises a charge tunneling area, a charge storage area and a charge barrier area. The charge tunneling area is made from a Si-rich dielectric material and located on the semiconductor layer. The charge storage area made from a Si-rich dielectric material has a plurality of silicon nanocrystals, wherein the charge storage area is located on the charge tunneling area. The charge barrier area made from a Si-rich dielectric material is located on the charge storage area. The gate electrode is disposed on the charge-storing dielectric layer.

The invention will become apparent from the following detailed description of the preferred but non-limiting embodiments. The following description is made with reference to the accompanying drawings.

DETAILED DESCRIPTION OF THE INVENTION

A number of preferred embodiments are disclosed below for elaborating the invention. The detailed structure of the non-volatile memory and the procedures of the manufacturing method disclosed in the following embodiments are for exemplification purpose only, not for limiting the scope of protection of the invention. The non-volatile memory is also called the non-volatile memory transistor. Moreover, secondary elements are omitted in the embodiments for highlighting technical features of the invention.

First Embodiment

FIGS. 1~8 show a method for manufacturing non-volatile memory according to a first embodiment of the invention.

Figure 1:
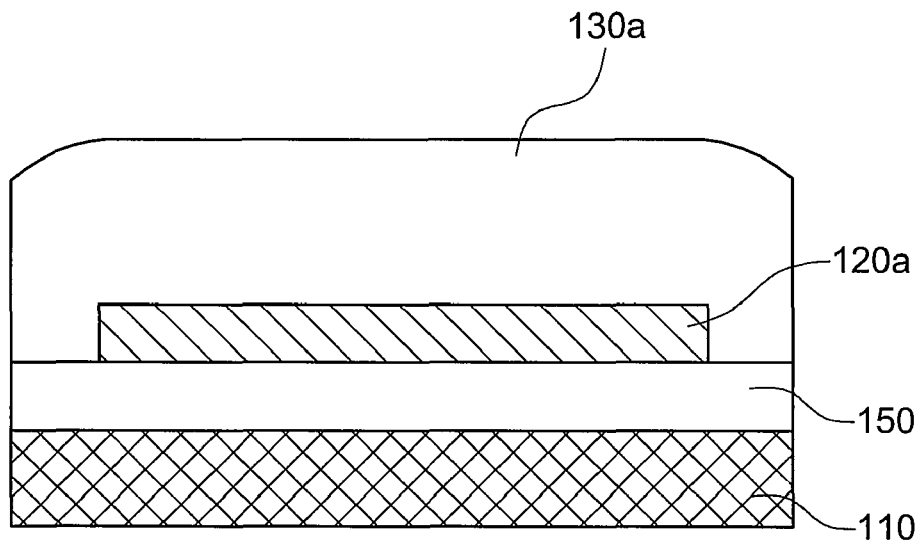
FIGS. 1~8 show a method for manufacturing non-volatile memory according to a first embodiment of the invention.

Referring to FIG. 1. Firstly, a substrate 110 such as Si-substrate, glass substrate or plastic substrate is provided. In the invention, the substrate is exemplified by a glass substrate.

Next, the present embodiment of the invention preferably comprises the step of forming a buffer layer 150 on the substrate 110. The buffer layer 150, which can be made from a material such as silicon dioxide ($SiO_2$) layer, silicon nitride ($Si_3N_4$) layer and amorphous silicon (a-Si) layer, can be formed on the substrate 110 by way of deposition. Thus, the buffer layer 150 can prevent the impurities (such as boron or sodium) of the substrate 110 from being diffused to a semiconductor layer 120 during the subsequent laser annealing process and tarnishing the semiconductor layer 120.

Next, an a-Si layer 120a is formed on the substrate 110. In the present embodiment of the invention, the buffer layer 150 is formed before the formation of the a-Si layer 120a, so the a-Si layer 120a is located on the buffer layer 150. After the a-Si layer 120a is formed, the a-Si layer 120a can be selectively converted to a polycrystalline layer by a laser annealing process and used as the semiconductor layer 120, or the present step can be combined with a subsequent step. In the present embodiment of the invention, the present step can be combined with the subsequent laser annealing process to save cost.

Then, a Si-rich dielectric layer 130a is formed on the semiconductor layer 120. The semiconductor layer 120 is the a-Si layer 120a in the present embodiment, so the Si-rich dielectric layer 130a is formed on the a-Si layer 120a. In the present embodiment of the invention, the Si-rich dielectric layer can be a silicon oxide (Si-rich SiOx) layer, a Si-rich silicon nitride (Si-rich SiNy) layer, a Si-rich silicon oxynitride (Si-rich SiOxNy) layer, a stacked layer thereof and other Si-rich compound. When the Si-rich dielectric material is Si-rich silicon oxide, the molecular formula of Si-rich silicon oxide is expressed as SiOx, wherein x is greater than 0 and smaller than 2. When the Si-rich dielectric material is Si-rich silicon nitride, the molecular formula of Si-rich silicon nitride is expressed as SiNy, wherein y is greater than 0 and smaller than 4/3 (that is, about 1.33). When the Si-rich dielectric material is Si-rich silicon oxynitride, the molecular formula of Si-rich silicon oxynitride is expressed as SiOxNy, wherein (x+y) is greater than 0 but smaller than 2.

In the present embodiment of the invention, the Si-rich dielectric layer 130a can be formed by plasma enhanced chemical vapor deposition (PECVD), wherein the plasma enhanced chemical vapor deposition deposits the Si-rich dielectric layer 130a by injecting a mixed gas such as silane ($SiH_4$), nitric oxide ($N_2O$) or ammonia ($NH_3$) and adjusting appropriate proportions so as to form Si-rich silicon oxide, Si-rich silicon nitride or Si-rich silicon oxynitride. For example, if the mixed gas being infused is silane ($SiH_4$) and nitric oxide ($N_2O$), then Si-rich silicon oxide (Si-rich SiOx) can be formed by deposition. If the mixed gas being infused is silane ($SiH_4$) and ammonia ($NH_3$), then Si-rich silicon nitride (Si-rich SiNy) can be formed by deposition. If the mixed gas being infused is silane ($SiH_4$), nitric oxide ($N_2O$) and ammonia ($NH_3$), then Si-rich silicon oxynitride (Si-rich SiOxNy) can be formed by deposition. Furthermore, on the part of the material layer, the higher the silicon is contained in the material layer, the larger the refractive index will be. The refractive index of silicon dioxide is 1.46. The refractive index of the Si-rich dielectric layer 130a of the present embodiment of the invention at least is greater than 1.5. Besides, in the present embodiment of the invention, the Si-rich dielectric layer 130a is a light absorbing material to facilitate the subsequent laser annealing process.

Figure 2:
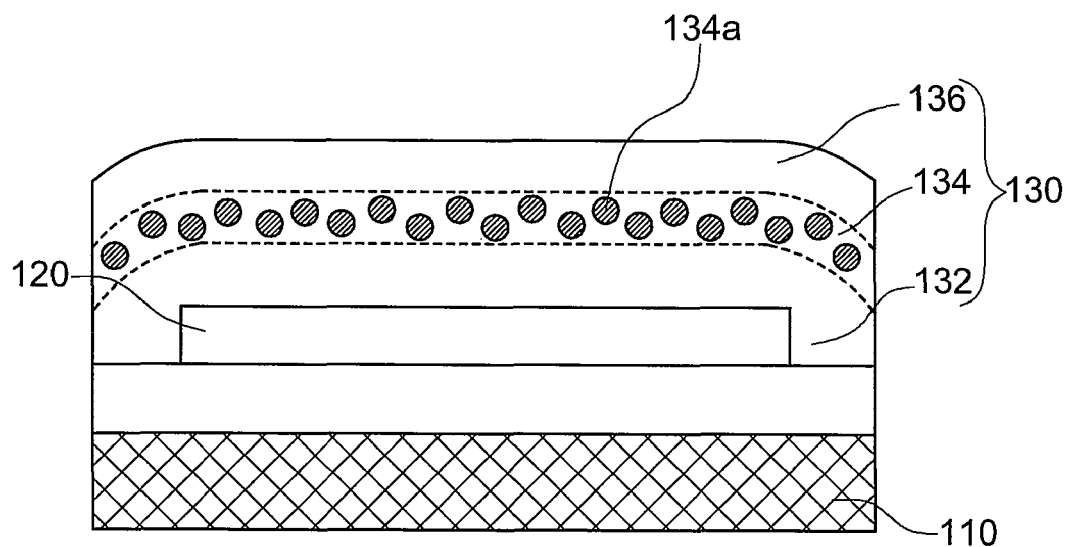

Referring to both FIG. 1 and FIG. 2, a plurality of silicon nanocrystals 134a are formed in the Si-rich dielectric layer 130a by a laser annealing process. As laser can be focused at a specific depth, a plurality of silicon nanocrystals 134a can be formed in the Si-rich dielectric layer 130a by the laser annealing process, so that the Si-rich dielectric layer 130a can be divided into a charge storage area 134 having silicon nanocrystals 134a, and a charge tunneling area 132 and a charge barrier area 136 having no silicon nanocrystal 134a and respectively located at the bottom and the top of the charge storage area 134, wherein the Si-rich dielectric layer comprising the charge tunneling area 132, the charge storage area 134 and the charge barrier area 136 is called the charge-storing dielectric layer 130. On the part of the charge-storing dielectric layer 130, the charge tunneling area 132 made from a Si-rich dielectric material is located on the semiconductor layer 120, the charge storage area 134 made from a Si-rich dielectric material has a plurality of silicon nanocrystals 134a and is located on the charge tunneling area 132, and the charge barrier area 136 also made from a Si-rich dielectric material is located on the charge storage area 134. That is, the Si-rich dielectric layer 130a precipitates a plurality of silicon nanocrystals 134a by the laser annealing process, so that the internal part of the Si-rich dielectric layer 130a forms a partition due to material distribution and further forms the charge-storing dielectric layer 130.

In the present embodiment of the invention, the particle diameter of the silicon nanocrystals 134a ranges between 0.5-20 nanometer, and preferably ranges between 3-10 nanometer. The particle diameter of the silicon nanocrystals has appropriate size and uniformed distribution, hence avoiding the electrons jumping to nearby nanocrystals or penetrating the underneath oxide layer so as to result in the leakage of current if the crystals are too big and close to each other.

The laser annealing process of the present embodiment of the invention is preferably an excimer laser annealing process whose operating temperature can be below 400° C. and will not damage the Si-substrate and glass substrate. In the present embodiment of the invention, the substrate 110 can be selected from a Si-substrate or glass substrate, and the method for manufacturing non-volatile memory can even be combined with the low temperature polysilicon process.

Moreover, while the silicon nanocrystals 134*a* is formed by the laser annealing process, the a-Si layer 120*a* as indicated in FIG. 1 can be converted to a polycrystalline layer by the same laser annealing process and used as a semiconductor layer 120. Thus, the silicon nanocrystals 134*a* and the semiconductor layer 120 are concurrently formed so that the cost is effectively reduced. However, the method for forming the semiconductor layer 120 is not limited to adopting the laser annealing process. The semiconductor layer 120 and the charge-storing dielectric layer 130 can be formed by the same laser annealing process at the same time or formed by the same laser annealing process but at different times. For example, after the a-Si layer 120*a* is formed, the a-Si layer 120*a* can be converted to a polycrystalline layer by a first laser annealing process and used as the semiconductor layer 120 first, and then the Si-rich dielectric layer 130*a* can precipitate a plurality of silicon nanocrystals 134*a* by a second laser annealing process next.

Figure 3:
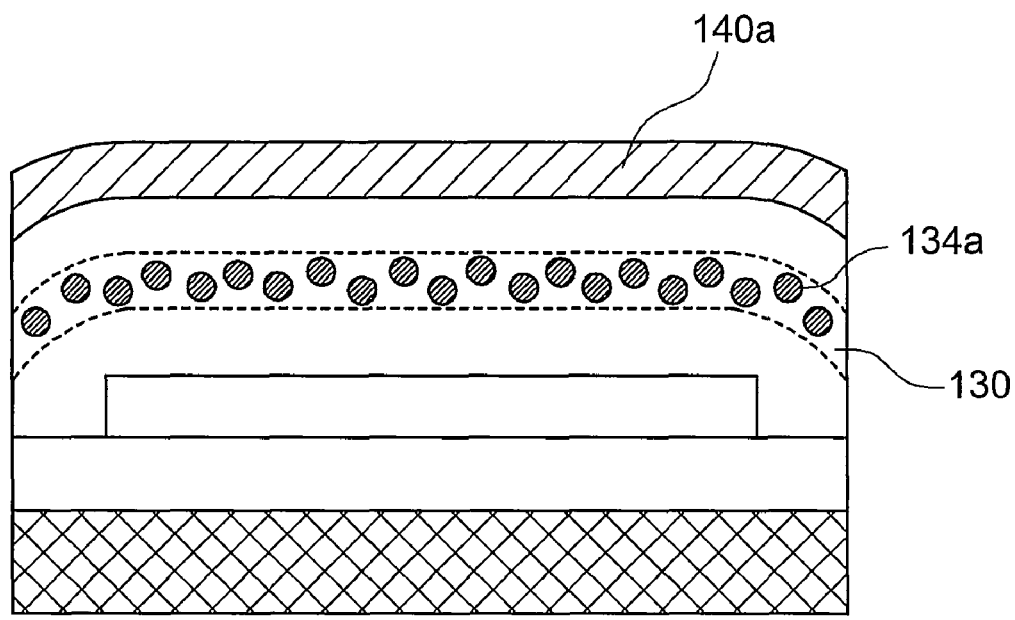
Figure 4:
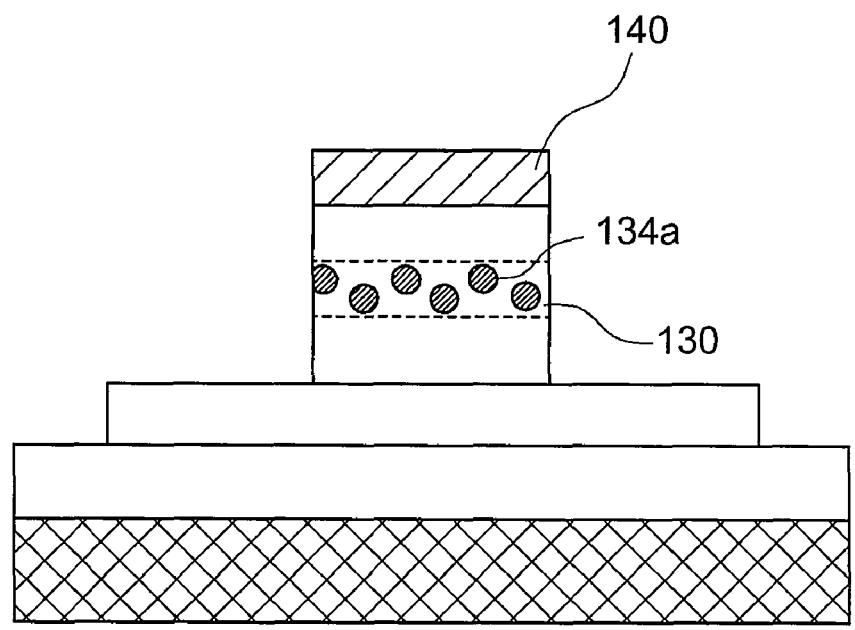

After that, referring to FIG. 3 and FIG. 4. Firstly, a conductive layer 140*a* is formed on the charge-storing dielectric layer 130. Next, a gate electrode 140 is formed on a Si-rich dielectric layer 130*a* with silicon nanocrystals 134*a* by a patterning process. That is, the gate electrode 140 is formed on the charge-storing dielectric layer 130 for exposing a part of the semiconductor layer 120. In a preferred embodiment, the gate electrode 140 and the charge-storing dielectric layer 130 can use the same pattern mask during the patterning process, so that the steps of the manufacturing process are integrated to effectively bring the cost down.

Figure 5:
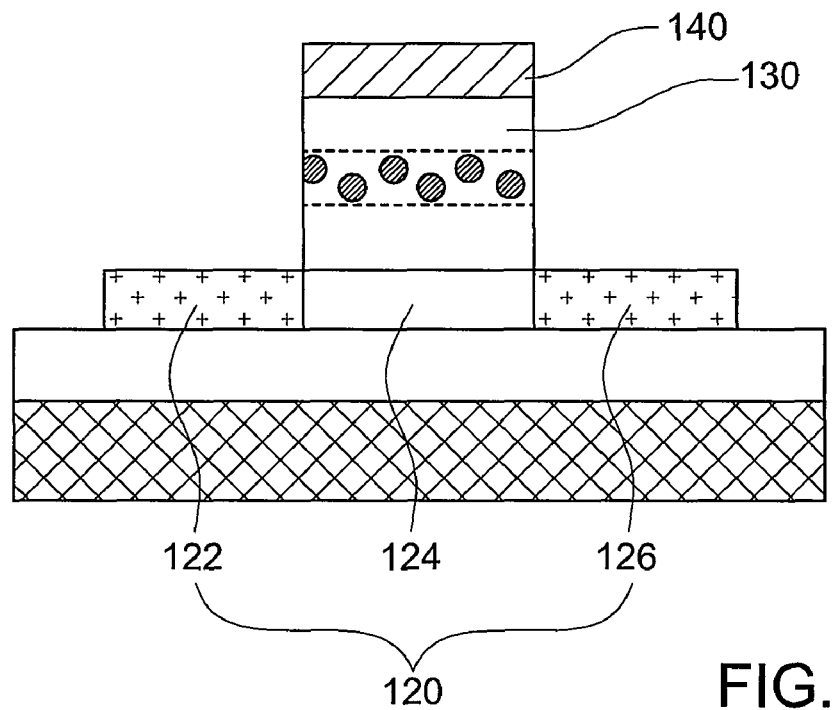

Afterwards, referring to FIG. 5. Next, the exposed part of the semiconductor layer 120 is partly doped by a doping process so that a first doping area 122, a second doping area 126 and a channel area 124 disposed therebetween are formed in the semiconductor layer 120. In the present embodiment of the invention, the step of partly doping the semiconductor layer 120 uses the gate electrode 140 as a mask and then the semiconductor layer 120 is doped by an n-type dopant or p-type dopant (such as phosphor or boron) so as to form the first doping area 122 and the second doping area 126 and the channel area 124 disposed therebetween, i.e. between the first doping area 122 and the second doping area 126.

The gate electrode 140 and the charge-storing dielectric layer 130 can be patterned by the same patterning process at the same time or patterned by the same patterning process but at different times, wherein, the step of patterning the charge-storing dielectric layer 130 can be performed before the laser annealing process. Furthermore, the step of partly doping the semiconductor layer 120 can be performed after the step of patterning the charge-storing dielectric layer 130 but before the step of forming the gate electrode 140. That is, the step of partly doping the semiconductor layer 120 does not have to be performed after the step of forming the gate electrode 140, and the sequence can be adjusted according to actual needs.

Figure 6:
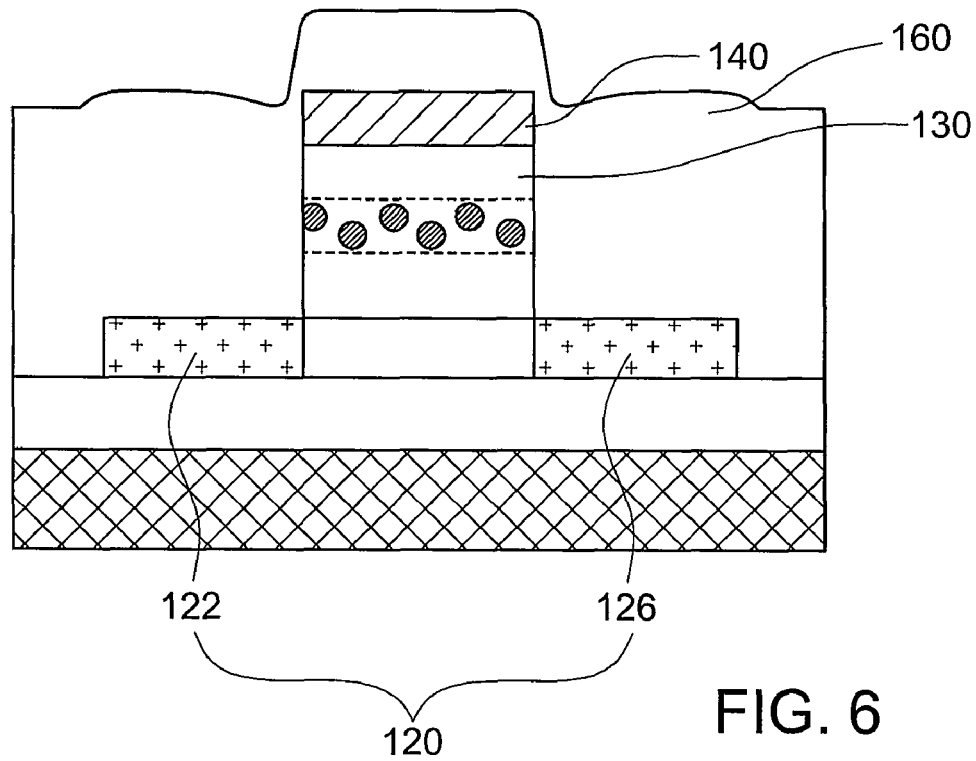
Figure 7:
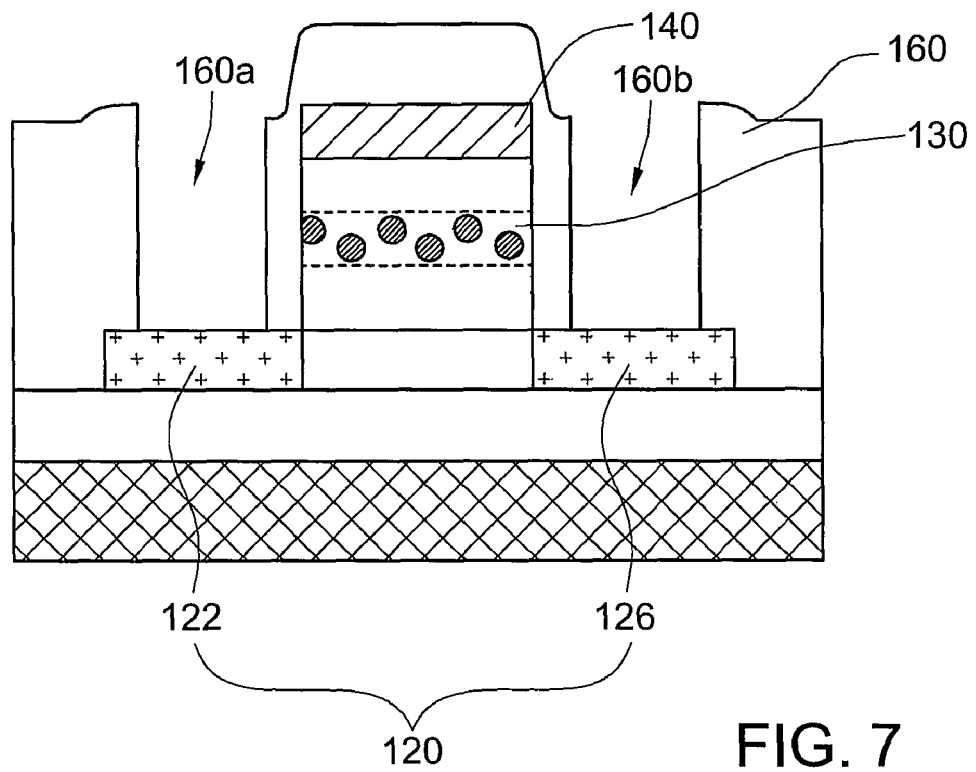

Next, referring to FIG. 6 and FIG. 7. Firstly, an inner dielectric layer 160 is formed on the semiconductor layer 120, the gate electrode 140 and the charge-storing dielectric layer 130. Next, a first opening 160*a* and a second opening 160*b* are formed on the inner dielectric layer 160 for exposing a first doping area 122 and a second doping area 126 of the semiconductor layer 120 respectively. The first doping area 122 can be used as a source doping area, and the second doping area 126 can be used as a drain doping area.

Figure 8:
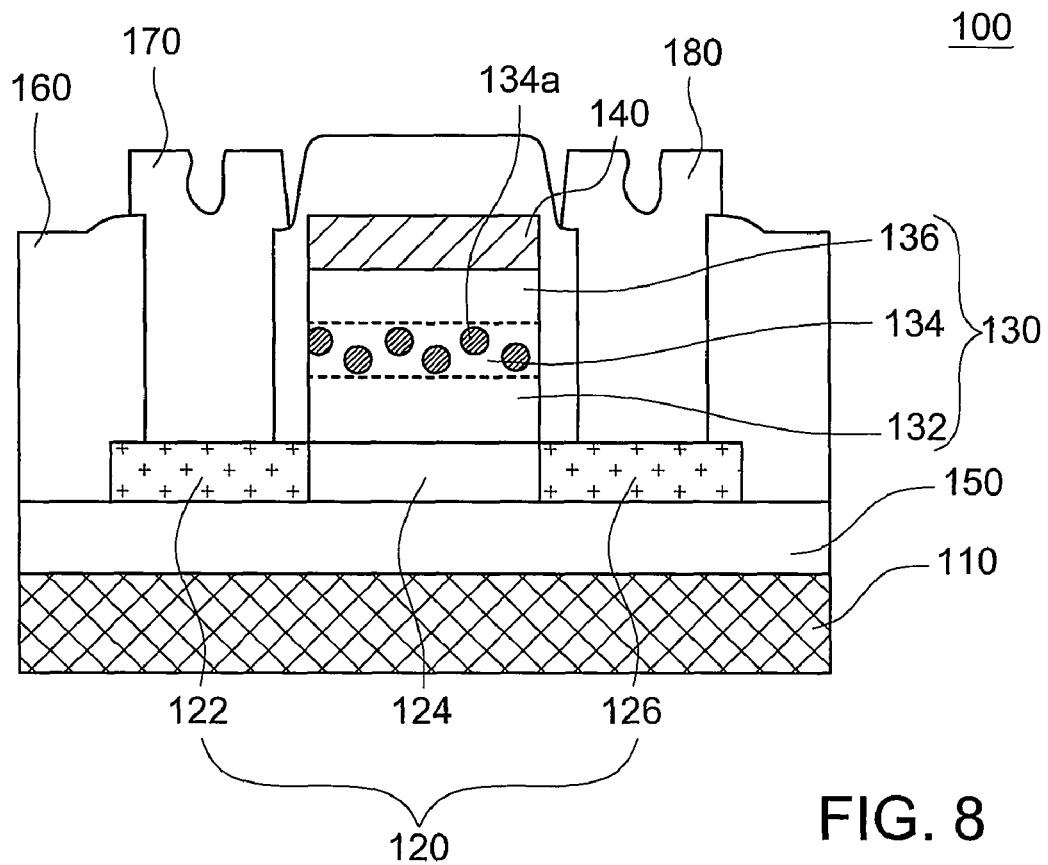

Referring to both FIG. 7 and FIG. 8. Firstly, a source electrode 170 is formed in the first opening 160*a* but on the inner dielectric layer 160, wherein the source electrode 170 is electrically connected to the first doping area 122 through the first opening 160*a*. Next, a drain electrode 180 is formed in the second opening 160*b* and on the inner dielectric layer 160, wherein the drain electrode 180 is electrically connected to the second doping area 126 through the second opening 160*b*. The inner dielectric layer 160 is interposed between the source electrode 170 and the drain electrode 180 and the charge-storing dielectric layer 130. The inner dielectric layer 160 makes the source electrode 170, the drain electrode 180 and the charge-storing dielectric layer 130 effectively isolated from one another, and avoids a leakage current of the charge-storing dielectric layer 130.

The structure of the non-volatile memory manufactured according to the above method is illustrated in FIG. 8. In the present embodiment of the invention, the non-volatile memory 100 comprises a substrate 110, a semiconductor layer 120, a charge-storing dielectric layer 130 and a gate electrode 140. The semiconductor layer 120 disposed on the substrate 110 comprises a first doping area 122, a second doping area 126 and a channel area 124, wherein the channel area 124 is located between the first doping area 122 and the second doping area 126. The charge-storing dielectric layer 130 is disposed on the channel area 124 of the semiconductor layer 120, wherein the charge-storing dielectric layer 130 comprises a charge tunneling area 132, a charge storage area 134 and a charge barrier area 136. The charge tunneling area 132 made from a Si-rich dielectric material is located on the channel area 124 of the semiconductor layer 120. The charge storage area 134 made from a Si-rich dielectric material has a plurality of silicon nanocrystals 134*a* and is located on the charge tunneling area 132. The charge barrier area 136 made from a Si-rich dielectric material is located on the charge storage area 134. The gate electrode 140 is disposed on the charge-storing dielectric layer 130.

Figure 9:
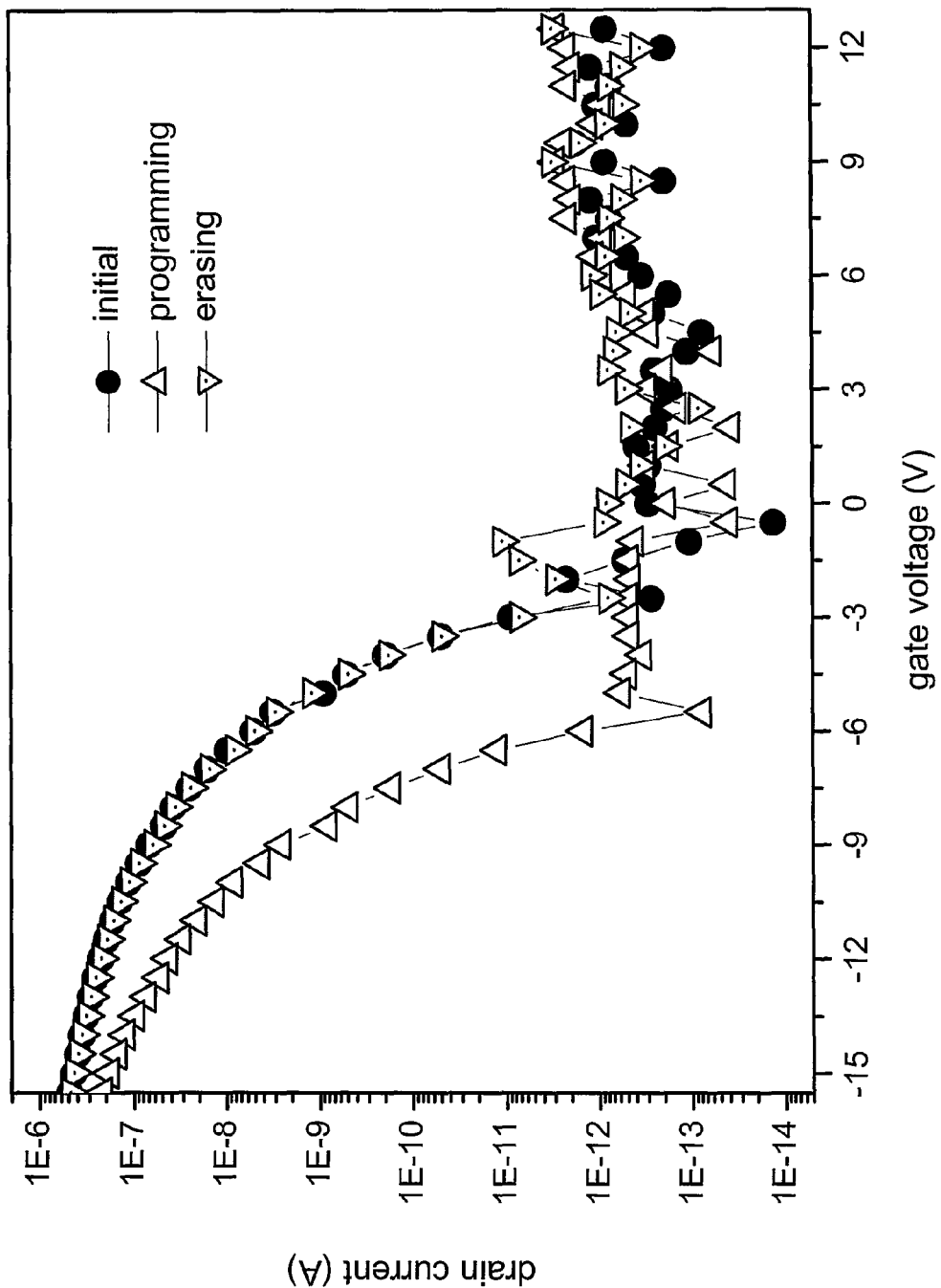
FIG. 9 shows a threshold voltage characteristics curve of a non-volatile memory according to a first embodiment of the invention.

An electrical test is applied to the non-volatile memory 100 of the present embodiment of the invention. Referring to both FIG. 8 and FIG. 9. FIG. 9 shows a threshold voltage characteristics curve of a non-volatile memory according to a first embodiment of the invention. The electrical charges stored in the charge-storing dielectric layer 130 can be electrons or electron holes. In the present embodiment of the invention, the non-volatile memory 100 is a p-type non-volatile memory for example. Thus, when the non-volatile memory 100 performs programming, a voltage of −15V is applied to the gate electrode 140 and a voltage of −10V is applied to the drain electrode 180 so that the electron holes are speeded up enter the charge storage area 134 from the first doping area 122 and are stored in the silicon nanocrystals 134*a*. When the non-volatile memory 100 performs erasing, a voltage of 15V is applied to the gate electrode 140 and a voltage of −10V is applied to the drain electrode 180 so that the electron holes stored in the silicon nanocrystals 134*a* are excluded and erased. In a variation of an embodiment of the invention, the non-volatile memory 100 can be an n-type non-volatile memory and achieve the above function by electrons.

In the present embodiment of the invention, the silicon nanocrystals 134*a* are formed by the laser annealing process at a low temperature (<400° C.), so the substrate 110 can be selected from a Si-substrate or even a glass substrate requiring low temperature process. The laser annealing process has the advantages of selecting the Si-substrate and the glass substrate as well as being compatible with the current low temperature polysilicon process. Furthermore, the silicon nanocrystals 134*a* formed by the laser annealing process has high density and 3-D distribution, hence effectively increasing the charge storage capacity of the charge-storing dielectric layer 130.

Second Embodiment

Figure 10:
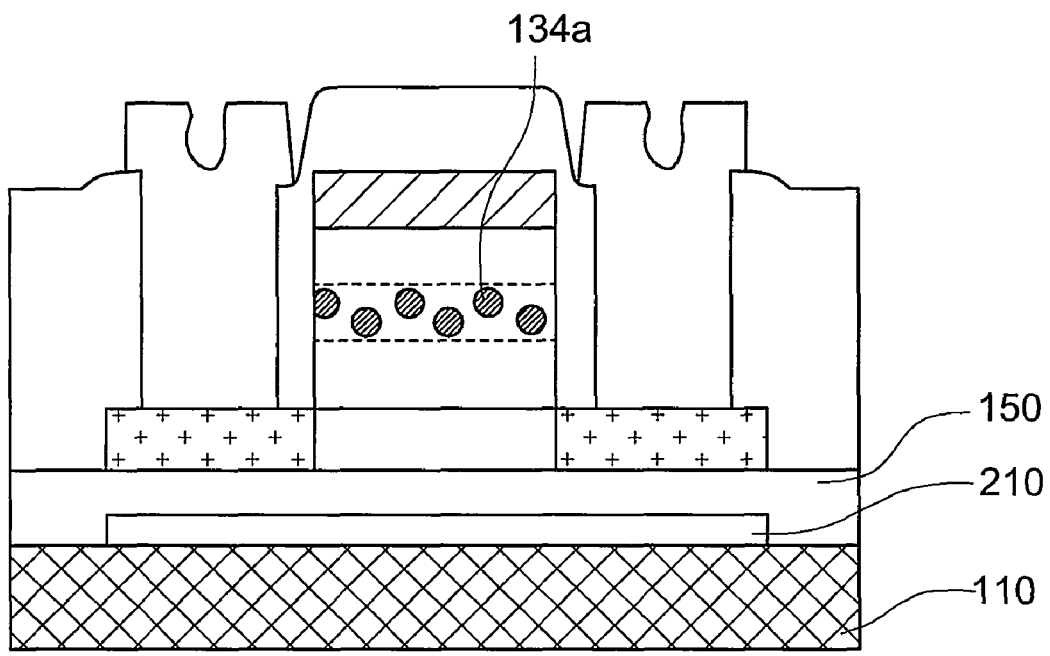
FIG. 10 shows a method for manufacturing non-volatile memory according to a second embodiment of the invention.

Referring to FIG. 10, a method for manufacturing non-volatile memory according to a second embodiment of the invention is shown. The non-volatile memory 200 of the second embodiment differs with the non-volatile memory 100 of the first embodiment only in the structure that the second embodiment preferably has a layer light blocking layer 210 (or a light absorbing layer). The manufacturing method and structure of the second embodiment are similar to that of the first embodiment, and the similarities in terms of structure, material and design conditions are not repeated here.

As the silicon nanocrystals 134a is very sensitive to the light, the silicon nanocrystals 134a, when absorbing a light, will generate electrical charges and make the stored electrical charges lost or changed. Therefore, in the present embodiment of the invention, the non-volatile memory 200 preferably further comprises a light blocking layer 210 (or a light absorbing layer) made from a light blocking material such as metal or black resin or a light absorbing material such as Si-rich material for blocking the environmental light and avoiding the silicon nanocrystals 134a being affected by the environmental light, wherein the non-volatile memory 200 disposed between the substrate 110 and the buffer layer 150 is aligned with the channel area 124 of the semiconductor layer 120.

Third Embodiment

Figure 13:
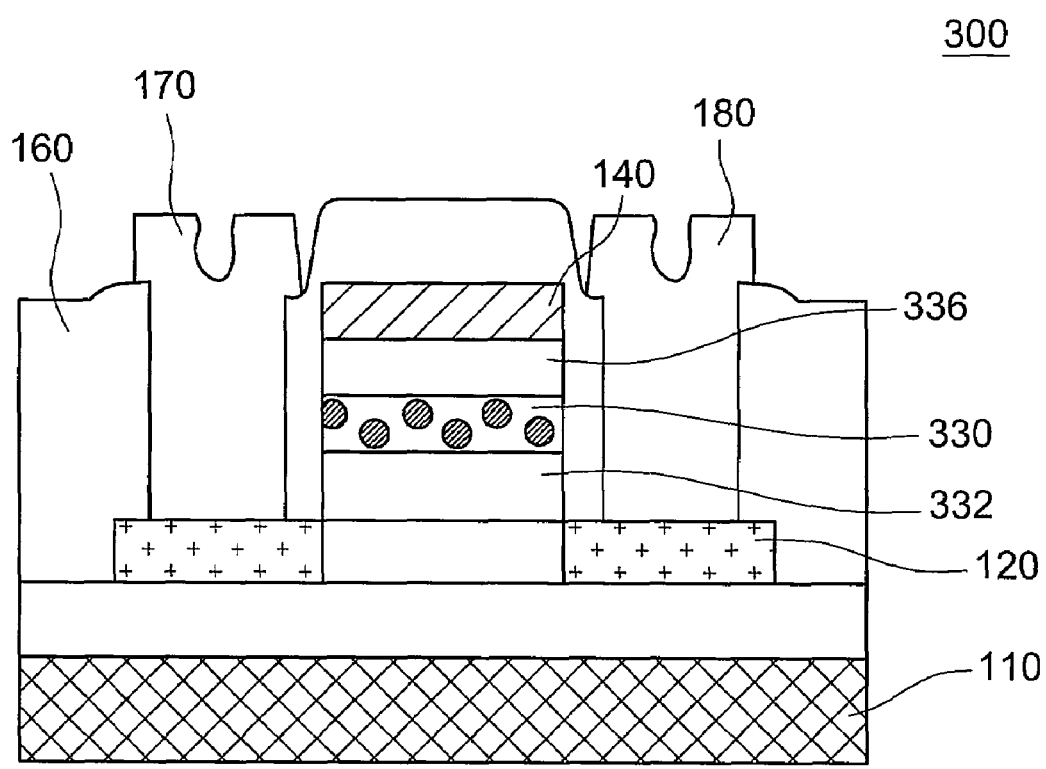

Referring to both FIG. 8 and FIG. 13. The non-volatile memory 300 of the third embodiment differs with the non-volatile memory 100 of the first embodiment in the structure of the charge storage layer 330 of the third embodiment, and the similarities in terms of structure, material and design conditions are not repeated here.

Figure 11:
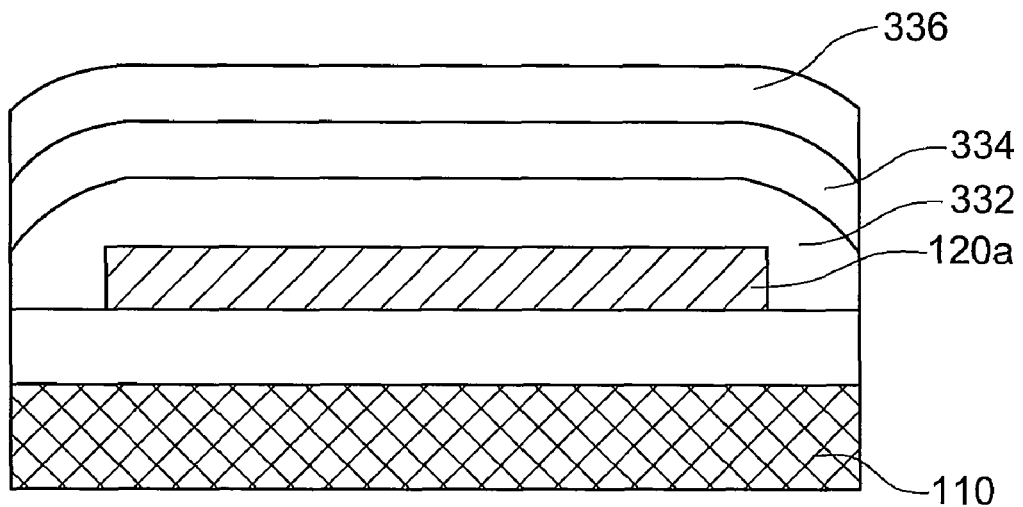
FIGS. 11~13 show a method for manufacturing non-volatile memory according to a third embodiment of the invention.
Figure 12:
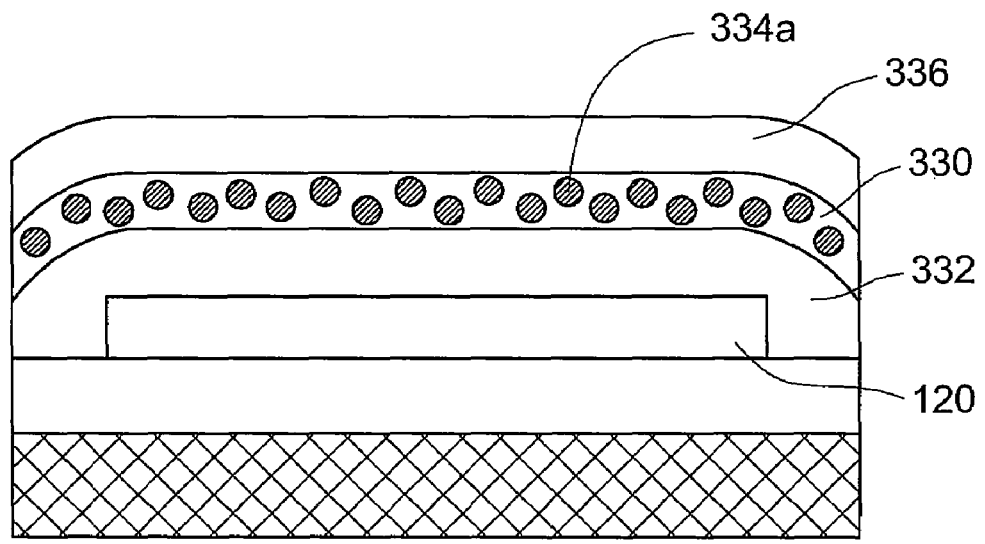

FIGS. 11~13 show a method for manufacturing non-volatile memory according to a third embodiment of the invention.

Referring to FIG. 11. In the present embodiment of the invention, a tunneling dielectric layer 332 is formed on the a-Si layer 120a of the substrate 110. Next, a Si-rich dielectric layer 334 is formed on the tunneling dielectric layer 332, and then a barrier dielectric layer 336 is formed on the Si-rich dielectric layer 334. In the present embodiment of the invention, the tunneling dielectric layer 332 and the barrier dielectric layer 336 can be made from a material such as silicon dioxide ($SiO_2$), and the characteristics of the material of the Si-rich dielectric layer 334 are similar to that disclosed in the first embodiment, and are not repeated here. In a modified embodiment, the tunneling dielectric layer 332 and the barrier dielectric layer 336 can be made of silicon rich oxide ($SiO_x$), and the Si-rich dielectric layer 334 can be made of silicon rich nitride ($SiN_y$).

Referring to both FIG. 11 and FIG. 12, a plurality of silicon nanocrystals 334a are formed in the Si-rich dielectric layer 334 by a laser annealing process, so that the Si-rich dielectric layer 334 forms a charge-storing dielectric layer 330. Likewise, polycrystalline used as a semiconductor layer 120 can be formed by the a-Si layer 120a during the laser annealing process or can be formed after the a-Si layer 120a is formed. As a tunneling dielectric layer 332 and a barrier dielectric layer 336 are respectively formed on the bottom and the top of the Si-rich dielectric layer 334, the thickness of the charge storage area in the charge-storing dielectric layer 330 is relatively increased, the storage capacity of the silicon nanocrystals 334a is increased, and the thickness of the charge tunneling area and the charge barrier area is decreased.

Referring to FIG. 13. As disclosed in the first embodiment, a gate electrode 140 is formed and patterned, a semiconductor layer is partly doped, an inner dielectric layer 160 is formed, and the source electrode 170 and the drain electrode 180 are formed.

The structure of the non-volatile memory manufactured according to the above method is illustrated in FIG. 13. In the present embodiment of the invention, the non-volatile memory 300 formed on the substrate 110 comprises a semiconductor layer 120, a tunneling dielectric layer 332, a charge-storing dielectric layer 330 and a barrier dielectric layer 336 and a gate electrode 140. The semiconductor layer 120 comprises a first doping area 122, a channel area 124 and a second doping area 126. The tunneling dielectric layer 332 is disposed between the semiconductor layer 120 and charge storage layer 330. The barrier dielectric layer 336 is disposed between the gate electrode 140 and the charge storage layer 330.

According to the non-volatile memory and the manufacturing method thereof disclosed in the above embodiments of the invention, the Si-rich dielectric layer precipitates a plurality of silicon nanocrystals by a laser annealing process, and the silicon nanocrystals are used as a charge-storing dielectric layer. As the laser annealing process can form silicon nanocrystals at a low temperature (<400° C.), the substrate can be selected from a Si-substrate and a glass substrate. If a conventional high temperature the annealing process (>900° C.) is adopted, the Si-substrate may be damaged due to partial heat treatment, so the glass substrate which requires a even lower temperature process cannot be selected. The laser annealing process has the advantages of selecting the Si-substrate and the glass substrate as well as being compatible with the current low temperature polysilicon process. Furthermore, the silicon nanocrystals 134a formed by the laser annealing process has high density 3-D distribution, hence effectively increasing the charge storage capacity of the charge-storing dielectric layer.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A non-volatile memory, comprising:
a substrate;
a semiconductor layer disposed on the substrate, wherein the semiconductor layer comprises:
  a first doping area;
  a second doping area; and
  a channel area located between the first doping area and the second doping area;
a charge-storing dielectric layer disposed on the semiconductor layer and made from a Si-rich dielectric material, wherein the charge-storing dielectric layer comprises:
  a charge tunneling area made from the Si-rich dielectric material and located on the semiconductor layer;
  a charge storage area made from the Si-rich dielectric material, wherein the charge storage area has a plu- rality of silicon nanocrystals and is located on the charge tunneling area; and a charge barrier area made from the Si-rich dielectric material and located on the charge storage area; and a gate electrode disposed on the charge-storing dielectric layer.

2. The non-volatile memory according to claim 1, further comprising:

a source electrode electrically connected to the first doping area; and a drain electrode electrically connected to the second doping area.

3. The non-volatile memory according to claim 1, further comprising:

an inner dielectric layer covering on the semiconductor layer, the gate electrode and the charge-storing dielectric layer.

4. The non-volatile memory according to claim 1, further comprising:

a buffer layer disposed between the semiconductor layer and the substrate.

5. The non-volatile memory according to claim 1, wherein the refractive index of the Si-rich dielectric material is greater than 1.5.

6. The non-volatile memory according to claim 1, wherein the molecular formula of the Si-rich dielectric material is expressed as SiOx, x is greater than 0 but smaller than 2.

7. The non-volatile memory according to claim 1, wherein the molecular formula of the Si-rich dielectric material is expressed as SiNy, y is greater than 0 but smaller than 4/3.

8. The non-volatile memory according to claim 1, wherein the molecular formula of Si-rich silicon oxynitride is expressed as SiOxNy, (x+y) is greater than 0 but smaller than 2.

9. The non-volatile memory according to claim 1, wherein the particle diameter of the silicon nanocrystals ranges between 0.5-20 nanometer.

10. The non-volatile memory according to claim 1, wherein the semiconductor layer comprises a polycrystalline layer.

11. The non-volatile memory according to claim 1, further comprising a tunneling dielectric layer located between the semiconductor layer and the charge-storing dielectric layer.

12. The non-volatile memory according to claim 1, further comprising a barrier dielectric layer located between the charge-storing dielectric layer and the gate electrode.

13. The non-volatile memory according to claim 12, wherein a material of the Si-rich dielectric layer is Silicon-rich silicon nitride, and materials of the tunneling dielectric layer and the barrier dielectric layer are Silicon-rich silicon oxide, respectively.

14. The non-volatile memory according to claim 1, further comprising a light blocking layer located between the semiconductor layer and the substrate is aligned with the channel area of the semiconductor layer.

* * * * *